(12) United States Patent
Matsumoto et al.

(10) Patent No.: US 8,803,168 B2
(45) Date of Patent: Aug. 12, 2014

(54) LIGHT EMITTING MODULE

(71) Applicant: Koito Manufacturing Co., Ltd., Tokyo (JP)

(72) Inventors: Akihiro Matsumoto, Shizuoka (JP); Tetsuya Suzuki, Shizuoka (JP); Tomoyuki Nakagawa, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 13/715,498

(22) Filed: Dec. 14, 2012

(65) Prior Publication Data

US 2013/0099261 A1    Apr. 25, 2013

Related U.S. Application Data

(63) Continuation of application No. PCT/JP2011/003543, filed on Jun. 21, 2011.

(30) Foreign Application Priority Data

Jul. 26, 2010   (JP) ................................. 2010-167480

(51) Int. Cl.
  *H01L 29/18*   (2006.01)
(52) U.S. Cl.
  USPC ............................................. 257/88; 257/99
(58) Field of Classification Search
  USPC .................................................... 257/88, 99
  See application file for complete search history.

(56) References Cited

U.S. PATENT DOCUMENTS

| | | |
|---|---|---|
| 2003/0189830 A1 | 10/2003 | Sugimoto et al. |
| 2006/0284303 A1 | 12/2006 | Tokida |
| 2009/0267085 A1* | 10/2009 | Lee et al. ........................ 257/88 |

FOREIGN PATENT DOCUMENTS

| | | |
|---|---|---|
| JP | 2002-094122 A | 3/2002 |
| JP | 2003008072 A | 1/2003 |
| JP | 2005012155 A | 1/2005 |
| JP | 2005109382 A | 4/2005 |
| JP | 2006-351895 A | 12/2006 |
| JP | 2006339541 A | 12/2006 |
| JP | 2007087668 A | 4/2007 |
| JP | 2009135543 A | 6/2009 |
| JP | 2010010682 A | 1/2010 |

OTHER PUBLICATIONS

International Search Report, Aug. 9, 2011, 8 pages.
International Preliminary Report on Patentability, Feb. 12, 2013, 14 pages.
Office Action (Notification of Reason(s) for Refusal) issued on May 20, 2014, by the Japan Patent Office in corresponding Japanese Patent Application No. 2010-167480, and an English Translation of the Office Action. (9 pages).

* cited by examiner

*Primary Examiner* — Douglas Menz
(74) *Attorney, Agent, or Firm* — Buchanan Ingersoll & Rooney PC

(57) ABSTRACT

In a light emitting module, a semiconductor light emitting element is mounted on a mounting board. A plated layer is provided on the surface of the mounting board so as to be electrically connected to the semiconductor light emitting element mounted on the mounting board. The plated layer has a power feeding portion and an element connection portion. The power feeding portion extends, of the surfaces of the mounting board, from the upper surface on which the semiconductor light emitting element is to be mounted to a stepped surface located below the upper surface, so that power can be fed, on the stepped surface, to the semiconductor light emitting element. The element connection portions are provided on the upper surface such that a plurality of the semiconductor light emitting elements mounted on the upper surface are connected together in series.

7 Claims, 5 Drawing Sheets

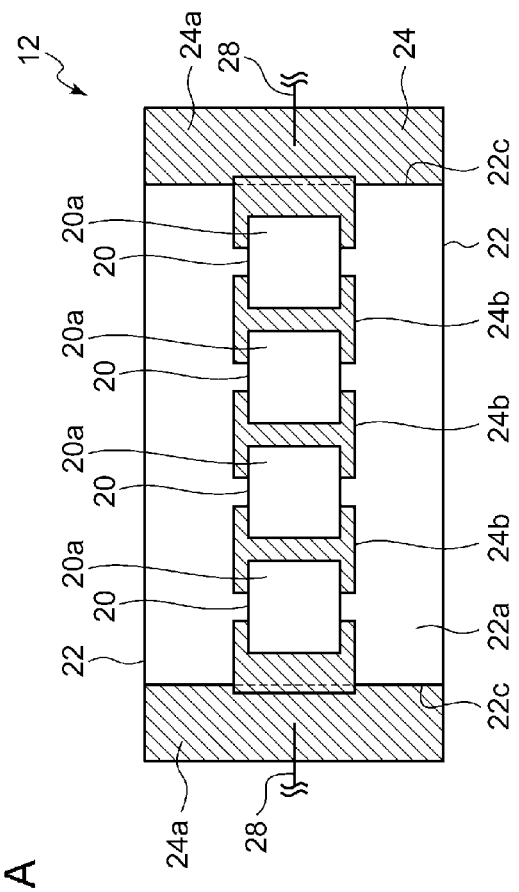
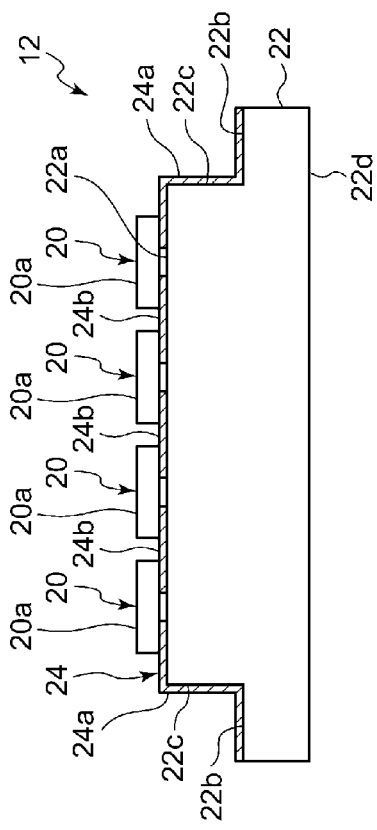
FIG.2A
FIG.2B

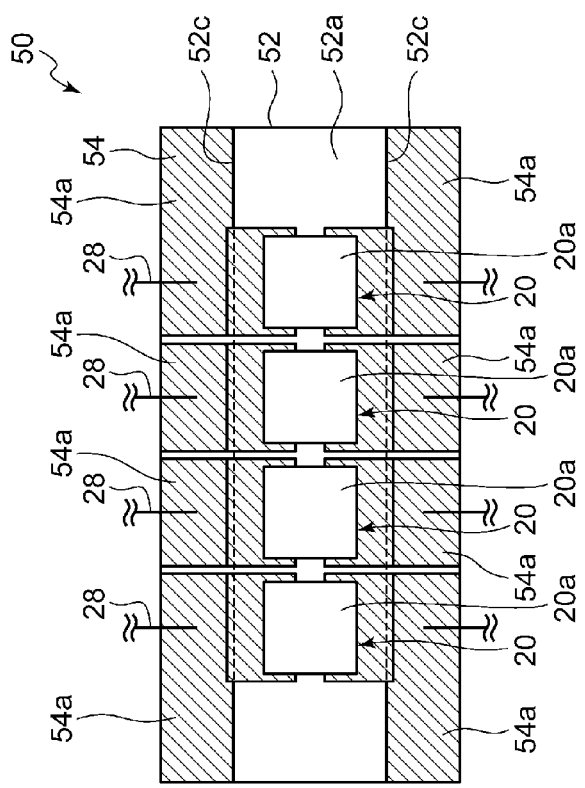
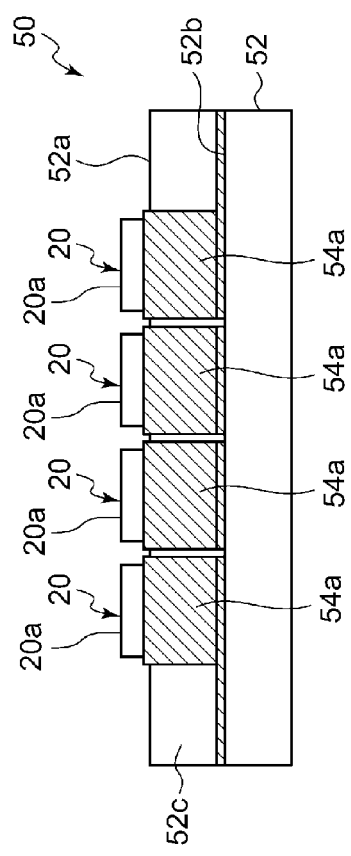
FIG.3A
FIG.3B

LIGHT EMITTING MODULE

BACKGROUND OF THE INVENTION

1. Field of the Invention

The present invention relates to a light emitting module, and in particular, to a light emitting module including a light emitting element and a mounting board for supporting the light emitting element.

2. Description of the Related Art

In recent years, the applications of semiconductor light emitting elements, such as LEDs (Light Emitting Diodes), are rapidly expanding, for example, to automotive headlamps, etc., because energy saving and high reliability, etc., are demanded. Accordingly, a light emitting device is presented, in which an LED is mounted on a sub-mount and the sub-mount is fixed to a metal plate (see, for example, Japanese Patent Application Publication No. 2007-87668).

In the aforementioned Patent Document, the sub-mount member and a lead pattern are connected together via an electrically-connecting member, such as a bonding wire. It is fundamentally preferable that such an electrically-connecting member is arranged below a light emitting surface in order to avoid an influence on light distribution by a shadow that has been caused by the electrically-connecting member. However, the bonding wire is arranged above the light emitting surface, for example, in the aforementioned Patent Document, and hence there is room for improvement from the viewpoint of avoiding an influence on light distribution by the electrically-connecting member. Even in the case where, by adopting, for example, a semiconductor light emitting element of a flip-chip type, power can be fed to the light emitting element from an electrode provided on the surface on which the element is mounted, it is also needed to use an electrically-connecting member, such as a bonding wire, for the connection between the electrode and a conductive member provided in another housing. Accordingly, also in such a case, it is not easy to achieve both omission of the step for the connection to the conductive member and avoidance of an influence on light distribution.

SUMMARY OF THE INVENTION

Therefore, the present invention has been made to solve the aforementioned problem, and a purpose of the invention is to simplify a method of manufacturing a light emitting module and to suppress an influence on light distribution by an electrically-connecting member for feeding power to a semiconductor light emitting element.

In order to solve the aforementioned problem, a light emitting module according to an embodiment of the present invention comprises: a mounting board on which a semiconductor light emitting element is to be mounted; and a conductive layer provided on a surface of the mounting board so as to be electrically connected to the semiconductor light emitting element mounted on the mounting board. The conductive layer includes a power feeding portion extending, of the surfaces of the mounting board, from a first surface on which the semiconductor light emitting element is to be mounted to a second surface located below the first surface, so that power can be fed, on the second surface, to the semiconductor light emitting element.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which:

FIG. 2A is a top view of the light emitting unit according to First Embodiment, and FIG. 2B is a front view of the light emitting unit according to First Embodiment;

FIG. 3A is a top view of a light emitting unit according to Second Embodiment, and FIG. 3B is a front view of the light emitting unit according to Second Embodiment;

DETAILED DESCRIPTION OF THE INVENTION

The invention will now be described by reference to the preferred embodiments. This does not intend to limit the scope of the present invention, but to exemplify the invention.

Hereinafter, preferred embodiments of the present invention (hereinafter, referred to as embodiments) will de described in detail with reference to the accompanying drawings.

First Embodiment

Figure 1:
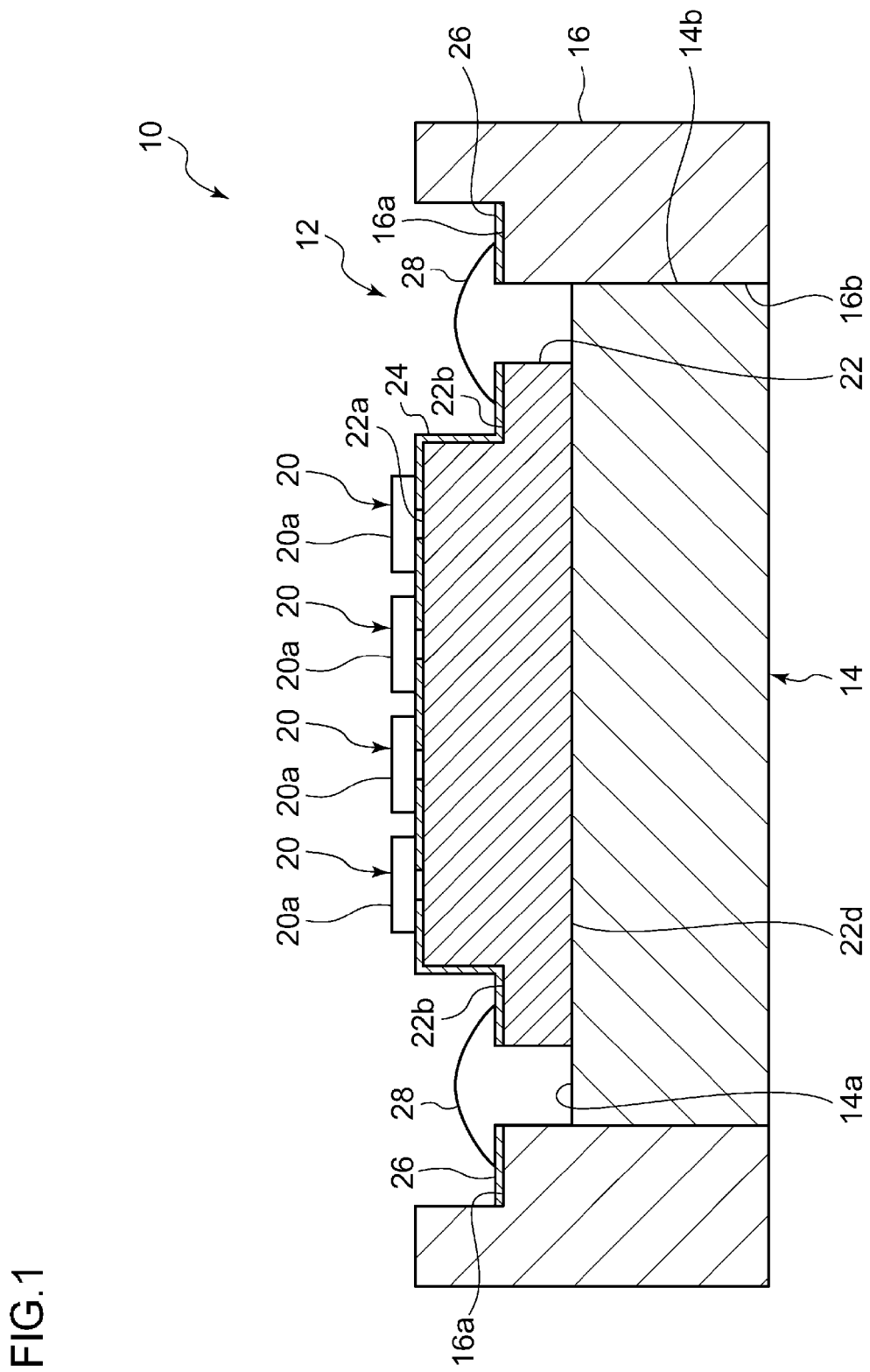
FIG. 1 is a view illustrating the structure of a light emitting unit according to First Embodiment.

FIG. 1 is a view illustrating the structure of a light emitting module 10 according to First Embodiment. FIG. 1 illustrates the section of the module 10 that is created by a vertical plane, when viewed from the side. The light emitting module 10 includes a light emitting unit 12, a supporting member 14, and a base housing 16.

The light emitting unit 12 has semiconductor light emitting elements 20, a mounting board 22, and a plated layer 24. An LED is adopted as each of the semiconductor light emitting elements 20. The LED may be a blue LED, an ultraviolet LED, or another LED that emits light of another color. Each of the semiconductor light emitting elements 20 is formed into a square shape of 1 mm×1 mm. Each of the semiconductor light emitting elements 20 may be formed into a square shape of a different size, such as, for example, 0.3 mm×0.3 mm, or may be formed into a rectangular shape other than square. Alternatively, instead of an LED, another semiconductor light emitting element having an element shape, which surface-emits light in an almost point-like pattern, such as, for example, a laser diode, may be adopted as the semiconductor light emitting element 20.

The mounting board 22 is formed of a single member made of alumina, AlN, or Si. The mounting board 22 is formed into a plate shape. The plated layer 24, a conductive layer, is provided on the surface of the mounting board 22 so as to be electrically connected to the semiconductor light emitting element 20 when the element 20 is mounted on the mounting board 22. Alternatively, instead of the plated layer 24, a conductive layer may be formed by depositing a conductive material on the surface of an upper surface 22a. Alternatively, instead of the plated layer 24, a plate-shaped member formed of a conductive material, which has been bent, may be firmly adhered to the surface of the mounting board 22.

A plurality of the semiconductor light emitting elements 20 are mounted on the upper surface 22a of the mounting board 22 such that they are linearly aligned. In this case, each of the plurality of the semiconductor light emitting elements 20 is mounted thereon such that the main light axis direction, i.e., the direction perpendicular to a light emitting surface 20a, is oriented upward. In First Embodiment, four semiconductor light emitting elements 20 are mounted on the single mounting board 22, but it is needless to say that the number of the semiconductor light emitting elements 20 to be mounted is not limited to four, and the number may be one or a plural number other than four. Also, the plurality of the semiconductor light emitting elements 20 may be mounted on the mounting board 22 such that they are arranged to be planarly dispersed.

A so-called flip-chip semiconductor light emitting element is adopted as each of the semiconductor light emitting elements 20. Each of the semiconductor light emitting elements 20 is connected to the plated layer 24 via an Au bump (not illustrated) and is mounted on the mounting board 22. Each of the semiconductor light emitting elements 20 is not limited to a flip-chip type, but, for example, a vertical chip type, or a face-up type may be adopted. In this case, the upper portion of the semiconductor light emitting element 20 is connected to the plated layer 24 on the mounting board 22 by an electrically-connecting member, such as a conductive wire.

In First Embodiment, the semiconductor light emitting element 20 is mounted directly on the mounting board 22, not via a so-called sub-mount substrate, as stated above. Thereby, a step for firmly adhering the sub-mount substrate and the mounting board together can be omitted.

The supporting member 14 supports the mounting board 22. By attaching the mounting board 22 to the supporting member 14 in this way, a heat radiating property can be further improved, in comparison with the case where, for example, the semiconductor light emitting element 20 is attached to a mounting board formed of AlN, etc., via a sub-mount substrate formed similarly of AlN, etc. The supporting member 14 is provided such that the area thereof is larger than that of the mounting board 22. Thereby, a decrease in the heat radiating property can be suppressed, while the mounting board 22, which is generally expensive, is being made small.

The supporting member 14 is fixed to the mounting board 22 in such a way that an upper surface 14a of the supporting member 14 touches a lower surface 22d of the mounting board 22, the surface 22d being opposite to the upper surface 22a thereof; thereby, supporting the mounting board 22. The supporting member 14 is formed of a metal whose heat radiating property is relatively high among metals, such as copper. Accordingly, the supporting member 14 functions as a heat radiating member.

In First Embodiment, the supporting member 14 is formed of a composite material made of both a metal having a smaller linear expansion coefficient than that of Cu and Cu. Specifically, the supporting member 14 is formed of a clad material in which Cu and Mo are laminated together. Hereinafter, this clad material is referred to as "CMC (Cu/Mo/Cu)". The CMC is formed by diffusion bonding of Cu plates and an Mo plate with a hot press. Mo has a smaller linear expansion coefficient than that of Cu. By adopting such a clad material as a material for the supporting member 14, a linear expansion coefficient can be made smaller than that of Cu, while a coefficient of thermal conductivity is maintained at a level similar to that of Cu. Accordingly, a difference with the linear expansion coefficient of the mounting board 22 can be reduced and occurrence of a crack, which may be caused in the supporting member 14 or the mounting board 22 due to a thermal stress generated between the two, can be suppressed.

The supporting member 14 is formed with Cu and Mo being laminated together such that each of two Mo layers is sandwiched in each of the two spaces among three Cu layers. It is needless to say that the number of laminations of Cu and Mo in the supporting member 14 is not limited to this aspect.

A material for the supporting member 14 is not limited to CMC, but, for example, a Cu—Mo powder composite material, in which an object formed of Mo powders is impregnated with Cu, may be adopted. Alternatively, a special clad material, in which the Cu—Mo powder composite material is sandwiched by Cu plates, may be adopted. This special clad material is formed by sandwiching the Cu—Mo powder composite material with the Cu plates and then by hot-rolling the sandwiched object. Alternatively, a clad material, in which an invar metal having a smaller linear expansion coefficient than that of Cu is sandwiched by Cu plates, may be adopted. The invar metal is an alloy made of Ni and Fe.

The mounting board 22 is bonded to the supporting member 14 with solder, which is a bonding material for metals having a melting point of 450° C. or lower. Because the difference between the linear expansion coefficient of the mounting board 22 and that of the supporting member 14 is small, such a bonded material can suppress occurrence of a crack due to a thermal stress, while securing a high heat radiating property. Alternatively, the mounting board 22 may be bonded to the supporting member 14 by an adhesive made of a material having a coefficient of thermal conductivity of 3 W/m*K or more. Thereby, the reliability for a ling period of time can be improved, while a heat radiating performance is being secured.

FIG. 2A is a top view of the light emitting unit 12 according to First Embodiment, and FIG. 2B is a front view of the light emitting unit 12 according to First Embodiment. For easy understanding, the plated layer 24 is illustrated with hatching.

The mounting board 22 has a stepped surface 22b. The stepped surface 22b is provided so as to be located below the upper surface 22a and to be parallel to the upper surface 22a. The plated layer 24 has a power feeding portion 24a and an element connection portion 24b. The power feeding portion 24a and the element connection portion 24b are arranged, on the surface of the mounting board 22, to be spaced apart from each other. The power feeding portion 24a extends, of the surfaces of the mounting board 22, from the upper surface 22a on which the semiconductor light emitting element is to be mounted to the stepped surface 22b located below the upper surface 22a via a side surface 22c, so that power can be fed, on the stepped surface 22b, to the semiconductor light emitting element 20. Thereby, an Au wire 28 can be bonded, below the upper surface 22a, to the power feeding portion 24a. Two power feeding portions 24a are provided and arranged such that each of the portions 24a is electrically connected to each of the two semiconductor light emitting elements 20 that are arranged at both ends of the plurality of the semiconductor light emitting elements 20 linearly aligned.

The element connection portions 24b are provided on the upper surface 22a such that the plurality of the semiconductor light emitting elements 20 mounted on the upper surface 22a are connected together in series by connecting the adjacent semiconductor light emitting elements 20 with the element connection portion 24b. In First Embodiment, four semiconductor light emitting elements 20 are provided, and hence three element connection portions 24b are provided, the number being equal to the number of the spaces between the four semiconductor light emitting elements 20. By a current is supplied between the two power feeding portions 24a in this way, power can be fed to all of the plurality of the semiconductor light emitting elements 20.

As the method of forming a route through which power is fed to the semiconductor light emitting elements 20, a method can be considered, in which an electrode electrically connected to the semiconductor light emitting element 20 is provided on the upper surface 22a; and a conductive member, such as copper, is provided on the stepped surface 22b, separately from the electrode on the upper surface 22a. In this method, however, it is needed to connect the electrode on the upper surface 22a of the mounting board 22 to the conductive member on the stepped surface 22b with a linear electrically-connecting member, such as an Au wire, or with a belt-shaped electrically-connecting member, such as an aluminum ribbon. Accordingly, a step for attaching the electrically-connecting member is separately required, and further it is not easy to attach the electrically-connecting member so as not to protrude above the light emitting surface 20a.

Therefore, the power feeding portion 24a and the element connection portion 24b are simultaneously and firmly adhered to the surface of the mounting board 22 by a plating treatment in First Embodiment. Thereby, a step for bonding an Au wire for connecting the plated layer 24 to another conductive member, the step being performed separately from a step for providing the plated layer 24, can be omitted. Thereby, a method of manufacturing the light emitting unit 12 can be simplified.

Alternatively, instead of the stepped surface 22b, the power feeding portion 24a may be provided so as to extend, of the surfaces of the mounting board 22, to a surface located below the upper surface 22a. Thus, by providing the power feeding portion 24a extending from the upper surface 22a to the surface located below the upper surface 22a such that power can be fed, on the surface, to the semiconductor light emitting element 20, power can be fed thereto below the upper surface 22a, without attaching an electrically-connecting member, such as an Au wire. Thereby, a method of manufacturing the light emitting unit 12 can be simplified, and an influence by the electrically-connecting member on the light distribution formed by the light emitted by the semiconductor light emitting element 20 can also be avoided.

Alternatively, instead of the stepped surface 22b, for example, an inclined surface, which is inclined from the upper surface 22a toward the lower side, may be provided. The power feeding portion 24a may be provided so as to extend from the upper surface 22a to the inclined surface. Alternatively, instead of the stepped surface 22b, a groove portion, which is concaved from the upper surface 22a to the lower side, may be provided, and the power feeding portion 24a may be provided so as to extend from the upper surface 22a to the bottom of the groove portion. With these structures, it also becomes possible to bond, below the upper surface 22a, the Au wire 28 to the power feeding portion 24a.

Referring back to FIG. 1, the base housing 16 is formed of a resin. It is needless to say that a material for the base housing 16 is not limited to a resin, and the base housing 16 may be formed of another insulating material. The base housing 16 has an opening 16b into which a side surface 14b of the supporting member 14 is fitted, so that the two are fixed together.

The base housing 16 has a stepped surface 16a provided to be parallel to the upper surface and to be located therebelow. The stepped surface 16a of the base housing 16 is located at a height approximately the same as that of the stepped surface 22b of the mounting board 22. The height of the stepped surface 16a may be different from that of the stepped surface 22b. A conductive member 26 having a thin plate shape is provided on the stepped surface 16a. The conductive member 26 is formed of copper, but may be formed of another conductive material.

The conductive member 26 is arranged to be spaced apart from the plated layer 24. An Au wire 28, an electrically-connecting member, is connected to both the plated layer 24 and the conductive member 26 so as to electrically connect the two together. Thus, the power for light emission can be fed to the plurality of the semiconductor light emitting elements 20 via the conductive member 26, the Au wire 28, and the plated layer 24.

Second Embodiment

FIG. 3A is a top view of a light emitting unit 50 according to Second Embodiment, and FIG. 3B is a front view of the light emitting unit 50 according to Second Embodiment. The structure of a light emitting module according to Second Embodiment is the same as in First Embodiment, except that: the light emitting unit 50 is provided instead of the light emitting unit 12; and the unit 50 is further provided such that power can be fed individually to each of the semiconductor light emitting elements 20. Hereinafter, parts similar to those in First Embodiment will be denoted with the same reference numerals and descriptions thereof will be omitted.

The light emitting unit 50 has a mounting board 52, a plated layer 54, and a plurality of the semiconductor light emitting elements 20. The mounting board 52 is formed of a single member made of alumina, AlN, or Si. The mounting board 52 is formed into a plate shape, and the plurality of the semiconductor light emitting elements 20 are mounted on the upper surface 52a of the mounting board 52. The plated layer 54, a conductive layer, is provided on the surface of the mounting board 52 so as to be electrically connected to the semiconductor light emitting elements 20 when the elements 20 are mounted on the mounting board 52.

The plurality of the semiconductor light emitting elements 20 are mounted on the mounting board 52 such that they are linearly aligned. Also, in Second Embodiment, four semiconductor light emitting elements 20 are mounted on the single mounting board 52, but it is needless to say that the number of the semiconductor light emitting elements 20 to be mounted is not limited to four, and the number may be one or a plural number other than four. Also, the plurality of the semiconductor light emitting elements 20 may be mounted on the mounting board 52 such that they are arranged to be planarly dispersed.

The mounting board 52 has a stepped surface 52b. The stepped surface 52b is provided so as to be located below the upper surface 52a and to be parallel to the upper surface 52a. The plated layer 54 has a plurality of power feeding portions 54a. The power feeding portions 54a are arranged, on the surface of the mounting board 52, to be spaced apart from each other. Each of the plurality of the power feeding portions 54a extends, of the surfaces of the mounting board 52, from the upper surface 52a on which the semiconductor light emitting elements 20 are to be mounted to the stepped surface 52b located below the upper surface 52a via a side surface 52c, so that power can be individually fed, on the stepped surface 52b, to each of the plurality of the semiconductor light emitting elements 20. Thereby, the Au wire 28 for feeding power individually to each of the plurality of the semiconductor light emitting elements 20 can be bonded, below the upper surface 52a, to the power feeding portion 54a.

Because two power feeding portions 54a feed power to one semiconductor light emitting element 20, the power feeding portions 54a, the number of which is two times the number of the semiconductor light emitting elements 20, are provided. Because four semiconductor light emitting elements 20 are provided in Second Embodiment, eight power feeding portions 54a are provided.

Two stepped surfaces 52b are provided so as to sandwich the semiconductor light emitting element 20. Each of the two stepped surfaces 52b extends in the direction parallel to the direction in which the semiconductor light emitting elements 20 are aligned. One of the two power feeding portions 54a for feeding power to one semiconductor light emitting element 20 is provided on one of the two stepped surfaces 52b, and the other power feeding portion 54a is provided on the other stepped surface 52b. Because four semiconductor light emitting elements 20 are mounted on the upper surface 52a of the mounting board 52 in Second Embodiment, four power feeding portions 54a extend from the upper surface 52a of the mounting board 52 to one of the stepped surfaces 52b, while the other four power feeding portions 54a extend therefrom to the other stepped surface 52b.

The respective power feeding portions 54a are simultaneously and firmly adhered to the surface of the mounting board 52 by a plating treatment. In this case, because the space between the arranged semiconductor light emitting elements 20, which are adjacent to each other, is small, it is needed to make the space between the adjacent power feeding portions 54a to be minute, in order to make the area of each of the power feeding portions 54a on the stepped surface 52b to be large.

Accordingly, in Second Embodiment, the four power feeding portions 54a to be formed on one stepped surface 52b are first formed in a plating treatment step as a plating in which they are linked together on the stepped surface 52b. After the plating treatment step, the plating in the space between the adjacent power feeding portions 54a is removed by a laser process, thereby separating the four power feeding portions 54a from each other. Alternatively, instead of a laser process, the four power feeding portions 54a may be separated from each other by a dicing process.

Thus, by providing a plurality of power feeding portions each extending, of the surfaces of the mounting board 52, from the upper surface 52a on which the semiconductor light emitting elements 20 are to be mounted to a surface located below the upper surface 52a such that power can be individually fed, on the surface, to each of the plurality of the semiconductor light emitting elements 20, power can be fed, below the upper surface 52a, to the semiconductor light emitting elements 20, without attaching an electrically-connecting member, such as an Au wire. Thereby, a method of manufacturing the light emitting unit 12 can be simplified, and an influence by the electrically-connecting member on the light distribution formed by the light emitted by the semiconductor light emitting element 20 can also be avoided.

Alternatively, instead of the stepped surface 52b, each of the plurality of the power feeding portions 54a may be provided so as to extend, of the surfaces of the mounting board 52, to a surface located below the upper surface 52a. By providing the plurality of power feeding portions 54a each extending from the upper surface 52a to the surface located below the upper surface 52a such that power can be individually fed, on the surface, to each of the plurality of the semiconductor light emitting elements 20, power can be individually fed, below the upper surface 52a, to each of the plurality of the semiconductor light emitting elements 20, without attaching an electrically-connecting member, such as an Au wire.

Alternatively, instead of the stepped surface 52b, for example, an inclined surface, which is inclined from the upper surface 52a toward the lower side, may be provided. The power feeding portion 54a may be provided so as to extend from the upper surface 22a to the inclined surface. Alternatively, instead of the stepped surface 52b, a groove portion, which is concaved from the upper surface 52a to the lower side, may be provided, and the power feeding portion 54a may be provided so as to extend from the upper surface 52a to the bottom of the groove portion. With these structures, it also becomes possible to bond, below the upper surface 52a, the Au wire 28 to the power feeding portion 54a.

Third Embodiment

Figure 4:
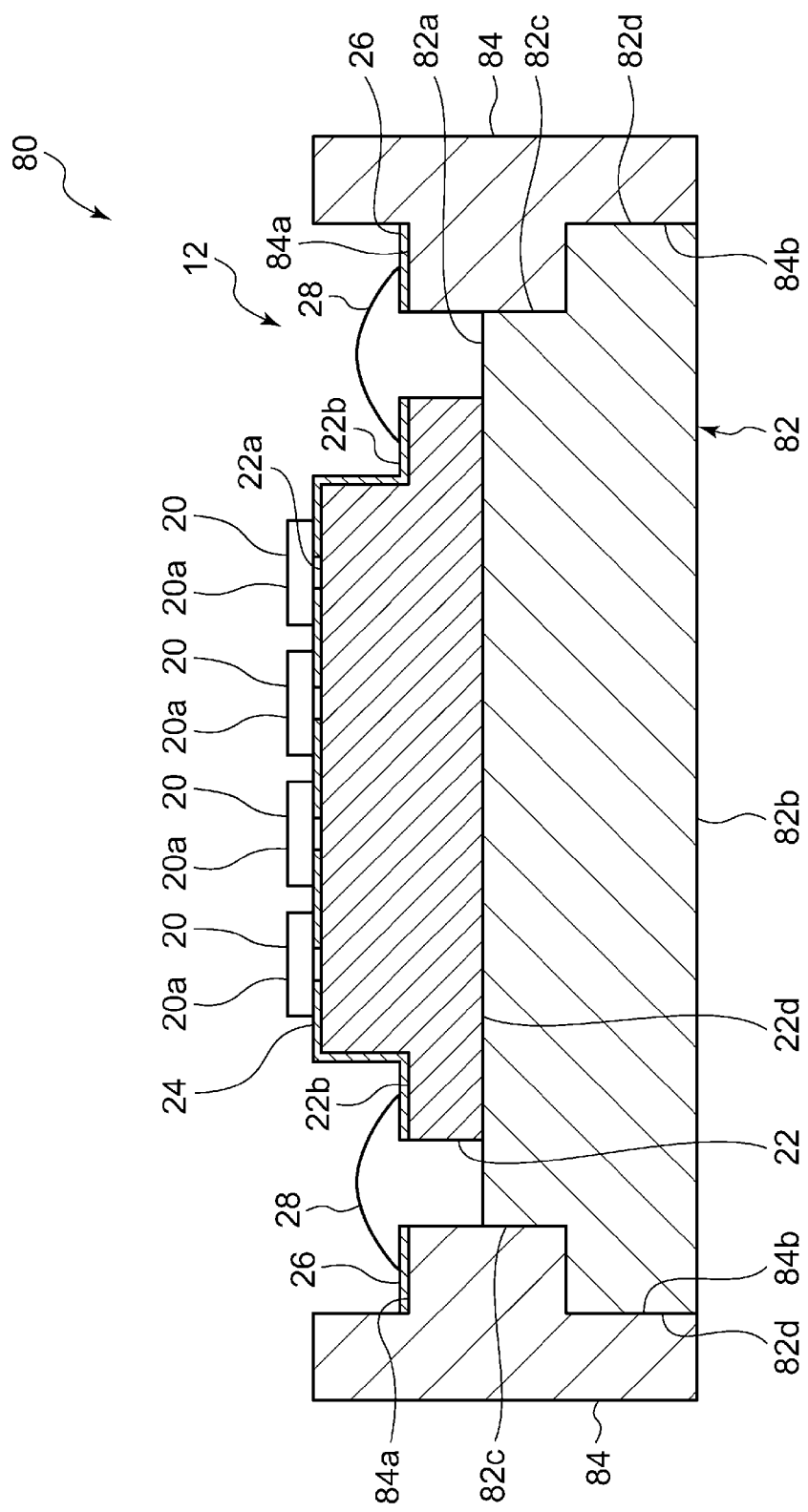
FIG. 4 is a view illustrating the structure of a light emitting module according to Third Embodiment.

FIG. 4 is a view illustrating the structure of a light emitting module according to Third Embodiment. Hereinafter, parts similar to those in the aforementioned embodiments will be denoted with the same reference numerals and descriptions thereof will be omitted.

A light emitting module 80 includes the light emitting unit 12, a supporting member 82, and a base housing 84. The supporting member 82 is formed such that the area of a lower surface 82b thereof, which is opposite to an upper surface 82a that contacts the mounting board 22, is larger than that of the upper surface 82a.

Specifically, in the supporting member 82, an enlarged portion 82d, which protrudes outside more than a side surface 82c near to the upper surface 82a, is provided near to the lower surface 82b. Thereby, the area of the lower surface 82b is made larger than that of the upper surface 82a. Accordingly, a concave portion 84b for housing the enlarged portion 82d is provided in the base housing 84. Other than this point, the base housing 84 is formed in the same way as the aforementioned base housing 16. Accordingly, the base housing 84 has a stepped surface 84a that is parallel to the upper surface and is provided below the upper surface, and the conductive member 26 is provided on the stepped surface 84a. Thus, by making the area of the lower surface 82b to be large, it becomes possible to release more heat from the lower surface 82b.

Fourth Embodiment

Figure 5:
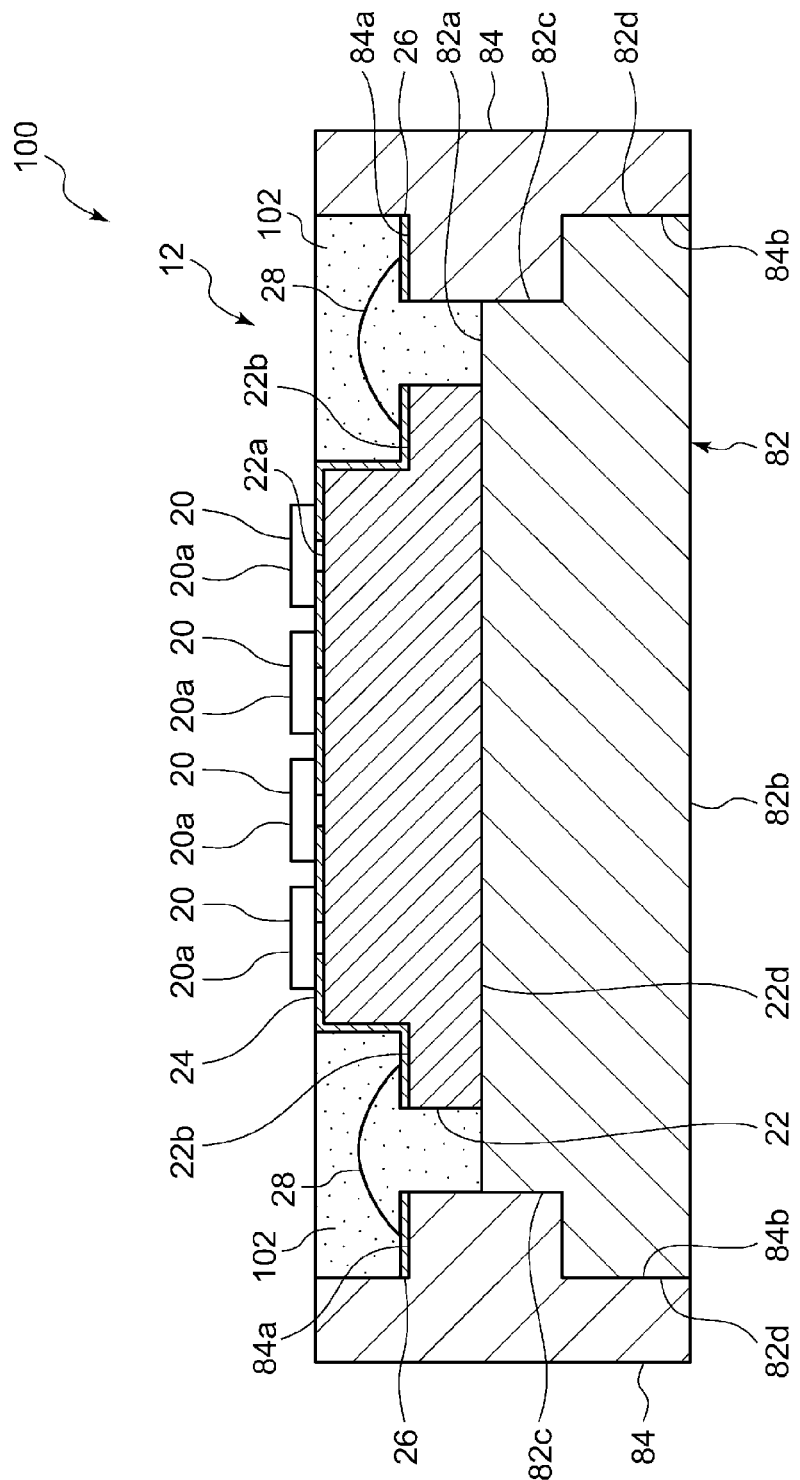
FIG. 5 is a view illustrating the structure of a light emitting module according to Fourth Embodiment.

FIG. 5 is a view illustrating the structure of a light emitting module 100 according to Fourth Embodiment. Hereinafter, parts similar to those in the aforementioned embodiments will be denoted with the same reference numerals and descriptions thereof will be omitted.

The light emitting module 100 is structured in the same way as the light emitting module 80 according to Third Embodiment, except that a sealing member 102 is provided in a groove portion formed by the light emitting unit 12, the supporting member 82, and the base housing 84.

The sealing member 102 is formed by filing the groove portion with a resin material and by solidifying the resin material, in order to seal the whole of the Au wire 28 in the groove portion from ambient air. Thereby, connection reliability of the Au wire 28 can be enhanced by protecting the Au wire from an external impact, and an influence on light distribution by the Au wire 28 can also be suppressed. Alternatively, the sealing member 102 may seal part of the Au wire 28, such as a bonding portion, from ambient air.

In Fourth Embodiment, the sealing member 102 is injected into the groove portion so as to be located below the upper surface of the plated layer 24 on which the semiconductor light emitting element 20 is mounted. Alternatively, the sealing member 102 may be injected into the groove portion so as to be located below the light emitting surface 20a of the semiconductor light emitting element 20, or may be injected thereinto so as to be located below the upper surface 22a of the mounting board 22.

Alternatively, a cover may be provided instead of the sealing member 102. The cover may be arranged above the Au wire 28 such that the Au wire 28 is located below the light emitting surface 20a. Alternatively, the cover may be arranged above the Au wire 28 such that the Au wire 28 is located below the upper surface 22*a* of the mounting board 22. In this case, the cover may be formed between the light emitting unit 12 and the base housing 84 so as to seal the groove portion in which the Au wire 28 is housed from ambient air. Accordingly, the cover also functions as a sealing means. Also, by providing a cover in this way, the connection reliability of the Au wire 28 can be enhanced, and an influence on light distribution by the Au wire 28 can be suppressed.

The present invention should not be limited to the aforementioned embodiments, and variations in which each component of the embodiments is appropriately combined are also effective as embodiments of the invention. Various modifications, such as design modifications, can be made with respect to the aforementioned embodiments based on the knowledge of those skilled in the art. Such modified embodiments can also fall in the scope of the invention. Hereinafter, such examples will be described.

In a variation, a substrate unit is formed in such a way that: the semiconductor light emitting element 20 is mounted on the upper surface of a plate-shaped sub-mount substrate; and the lower surface of the sub-mount substrate is fixed to the upper surface of a plate-shaped mounting board with solder, etc. Accordingly, the sub mount substrate also functions as a mounting board on which the semiconductor light emitting element 20 is mounted. A material for each of the sub-mount substrate and the mounting board may be the same as that of the aforementioned mounting board 22.

The sub-mount substrate is formed such that the area thereof is smaller than that of the mounting board. Accordingly, when the sub-mount substrate is fixed to the mounting board, a stepped surface is provided on the surface of the mounting board, the surface being not covered with the sub-mount substrate.

Also, in this case, a conductive layer is provided on the surface of the sub-mount substrate so as to be electrically connected to the semiconductor light emitting element 20 mounted on the sub-mount substrate. Also in this variation, the conductive layer includes a power feeding portion extending, of the surfaces of the sub-mount substrate, from the upper surface on which the semiconductor light emitting element 20 is to be mounted to the stepped surface of the mounting board, so that power can be fed, from the stepped surface, to the semiconductor light emitting element 20. In the aforementioned embodiments, even in the case where the mounting board 22 or 52 is formed by a combination of multiple members including a sub-mount substrate and a mounting board in this way, a step for bonding an Au wire to a conductive member provided on the upper surface of the sub-mount substrate, etc., can be omitted, and a method of manufacturing the light emitting unit 12 can be simplified.

A light emitting module according to an embodiment of the present invention comprises: a mounting board on which a semiconductor light emitting element is to be mounted; and a conductive layer provided on the surface of the mounting board so as to be electrically connected to the semiconductor light emitting element mounted on the mounting board. The conductive layer includes a power feeding portion extending, of the surfaces of the mounting board, from a first surface on which the semiconductor light emitting element is to be mounted to a second surface located below the first surface, so that power can be fed, on the second surface, to the semiconductor light emitting element.

According to this aspect, power can be fed, below the first surface on which the semiconductor light emitting element is to be mounted, to the power feeding portion by first connecting an electrically-connecting member, for example, by wire bonding thereof, etc. Accordingly, an amount of the upward protrusion of the electrically-connecting member can be suppressed, and an influence on light distribution by the electrically-connecting member can be easily suppressed. Further, with an easy step for providing a conductive layer extending from the first surface to the second surface, power can be easily fed, below the first surface, to the semiconductor light emitting element. Accordingly, a step for further wire-bonding the first surface and the second surface together, etc., can be omitted, and the two surfaces can be easily connected electrically. The conductive layer may be formed on the surface of the mounting board by plating or deposition.

The mounting board is provided such that a plurality of semiconductor light emitting elements are to be mounted on the first surface, and the conductive layer may further include element connection portions by which the plurality of the semiconductor light emitting elements mounted on the first surface are connected together in series. According to this aspect, a plurality of the semiconductor light emitting elements can be connected together in series on the first surface, and power can be fed, on the second surface below the first surface, to the plurality of semiconductor light emitting elements.

The mounting board is provided such that a plurality of semiconductor light emitting elements are to be mounted on the first surface, and the conductive layer may include a plurality of power feeding portions each extending from the first surface to the second surface such that power can be individually fed, on the second surface, to each of the plurality of the semiconductor light emitting elements mounted on the mounting board. According to this aspect, the plurality of the semiconductor light emitting elements can be connected together in parallel on the first surface, and power can be fed, on the second surface below the first surface, to each of the plurality of the semiconductor light emitting elements.

The aforementioned light emitting module may include: a conductive member arranged to be spaced apart from the conductive layer; an electrically-connecting member to be connected to both the conductive layer and the conductive member such that the two are electrically connected together; and a sealing member configured to seal at least part of the electrically-connecting member from ambient air. The sealing member is arranged so as to be located below the light emitting surface of the semiconductor light emitting element. According to this aspect, an influence on light distribution by the electrically-connecting member can be avoided, while the electrically-connecting member is being protected from an external impact by the sealing member.

The light emitting module may further comprise a heat radiating member having a contacting surface that contacts a back surface of the mounting board opposite to the first surface. The heat radiating member may be formed such that the area of the back surface opposite to the contacting surface is larger than that of the contacting surface. According to this aspect, the heat radiation by the back surface can be more prompted, thereby allowing the heat generation of the semiconductor light emitting element to be more suppressed.

The second surface may be a stepped surface that is located below the first surface and is parallel to the first surface. A light emitting module according to an embodiment of the present invention may further comprise: a base housing configured to support the mounting board; a conductive member provided on the surface of the base housing; and an electrically-connecting member to be connected to both the conductive layer and the conductive member such that the two are electrically connected together. The conductive member may be provided, of the surfaces of the base housing, on a surface located below the first surface such that the electrically-connecting member is arranged below the light emitting surface of the semiconductor light emitting element.

What is claimed is:

1. A light emitting module comprising:
    a mounting board on which a semiconductor light emitting element is to be mounted;
    a conductive layer provided on a surface of the mounting board so as to be electrically connected to the semiconductor light emitting element mounted on the mounting board;
    a conductive member arranged to be spaced apart from the conductive layer; and
    an electrically-connecting member to be connected to both the conductive layer and the conductive member such that the two are electrically connected together, wherein
    the conductive layer is arranged to electrically connect the electrically-connecting member and the semiconductor light emitting element together and includes a power feeding portion extending, of the surfaces of the mounting board, from a first surface on which the semiconductor light emitting element is to be mounted to a second surface located below the first surface, so that power can be fed, on the second surface, to the semiconductor light emitting element.

2. The light emitting module according to claim 1, wherein the mounting board is provided such that a plurality of semiconductor light emitting elements are to be mounted on the first surface, and wherein
    the conductive layer further includes element connection portions by which the plurality of the semiconductor light emitting elements mounted on the first surface are connected together in series.

3. The light emitting module according to claim 1, wherein the mounting board is provided such that a plurality of semiconductor light emitting elements are to be mounted on the first surface, and wherein
    the conductive layer includes a plurality of power feeding portions each extending from the first surface to the second surface such that power can be individually fed, on the second surface, to each of the plurality of the semiconductor light emitting elements mounted on the mounting board.

4. The light emitting module according to claim 1 further comprising
    a sealing member configured to seal at least part of the electrically-connecting member from ambient air, wherein
    the sealing member is arranged so as to be located below the light emitting surface of the semiconductor light emitting element.

5. The light emitting module according to claim 1 further comprising a heat radiating member having a contacting surface that contacts a back surface of the mounting board opposite to the first surface, wherein
    the heat radiating member is formed such that the area of the back surface opposite to the contacting surface is larger than that of the contacting surface.

6. The light emitting module according to claim 1, wherein the second surface is a stepped surface that is located below the first surface and is parallel to the first surface.

7. The light emitting module according to claim 1 further comprising a base housing configured to support the mounting board, wherein
    the conductive member is provided, of the surfaces of the base housing, on a surface located below the first surface such that the electrically-connecting member is arranged below the light emitting surface of the semiconductor light emitting element.

* * * * *